United States Patent [19]

Liang et al.

[11] Patent Number: 5,654,231
[45] Date of Patent: Aug. 5, 1997

[54] METHOD OF ELIMINATING BURIED CONTACT TRENCH IN SRAM TECHNOLOGY

[75] Inventors: Mong-Song Liang; Jin-Yuan Lee, both of Hsin-Chu; Chun-Yi Shih, Hsinchu, all of Taiwan

[73] Assignee: Taiwan Semiconductor Manufacturing Company, Ltd., Hsin-Chu, Taiwan

[21] Appl. No.: 621,273

[22] Filed: Mar. 25, 1996

[51] Int. Cl.$^6$ .................................................. H01L 21/28
[52] U.S. Cl. ........................... 438/197; 438/586; 438/533
[58] Field of Search .................................. 437/26, 186, 191, 437/193, 195, 228

[56] References Cited

U.S. PATENT DOCUMENTS

| | | | |
|---|---|---|---|
| 4,749,443 | 6/1988 | Mitchell et al. | 437/191 |
| 5,266,523 | 11/1993 | Manning | 437/193 |
| 5,350,712 | 9/1994 | Shibata | 437/195 |
| 5,462,893 | 10/1995 | Matsuoka et al. | 437/195 |
| 5,576,242 | 11/1996 | Liu | 437/193 |

OTHER PUBLICATIONS

S. Wolf, "Silicon Processing for the VLSI Era, vol. 2", Lattice Press, pp. 184 to 191, (1986).
S.Wolf–"Silicon Processing for the VLSI Era–vol. 2" Lattice Press, Sunset Beach, CA, pp. 160–162, 1990.

Primary Examiner—John Niebling
Assistant Examiner—Thomas G. Bilodeau
Attorney, Agent, or Firm—George O. Saile; Rosemary L. S. Pike

[57] ABSTRACT

A new method of forming an improved buried contact junction is described. A first polysilicon layer is deposited overlying a gate silicon oxide layer on the surface of a semiconductor substrate. The first polysilicon and gate oxide layers are etched away where they are not covered by a buried contact mask to provide an opening to the semiconductor substrate. Ions are implanted through the opening into the semiconductor substrate to form a buried contact junction. A layer of dielectric material is deposited over the first polysilicon layer and over the semiconductor substrate within the opening. The layer is anisotropically etched to leave spacers on the sidewalls of the first polysilicon layer and adjacent the opening. A second layer of polysilicon is deposited overlying the first polysilicon layer and over the substrate within the opening. The second polysilicon layer is patterned to form gate electrodes and a polysilicon contact overlying the buried contact junction wherein the mask used for the patterning is misaligned and a portion of a spacer overlying the buried contact junction is exposed and wherein a portion of the second polysilicon layer other than that of the contact remains as residue. The second polysilicon layer residue is etched away wherein the exposed spacer protects the buried contact junction within the semiconductor substrate from the etching to complete the formation of a buried contact in the fabrication of an integrated circuit.

20 Claims, 5 Drawing Sheets

METHOD OF ELIMINATING BURIED CONTACT TRENCH IN SRAM TECHNOLOGY

BACKGROUND OF THE INVENTION (1) Field of the Invention

The invention relates to the fabrication of integrated circuit devices, and more particularly, to a method of an improved buried contact without a trench in the fabrication of integrated circuits.

(2) Description of the Prior Art

A typical buried contact is formed by depositing a doped layer of polysilicon over and on the planned buried contact regions and heating the structure. The buried contact regions are doped by outdiffusion of dopants from the doped polysilicon layer into the silicon substrate. The doped polysilicon layer is allowed to remain on the buried contact regions as their contacts. If there is misalignment of the mask during etching of the polysilicon, a portion of the semiconductor substrate within the buried contact area will be exposed. During polysilicon overetching, a buried contact trench will be etched. This interrupts the transistor current flow path causing device failure.

*Silicon Processing for the VLSI Era*, Vol. 2 by Stanley Wolf, Lattice Press, Sunset Beach, Calif., c. 1990, pp. 160–162 describes the use of buried contacts and local interconnections. U.S. Pat. No. 5,350,712 to Shibata teaches the use of an additional metal width around a metal line to overcome mask misalignment problems causing etching of the semiconductor substrate. Co-pending U.S. patent application Ser. No. 08/488,764, now U.S. Pat. No. 5,525,552 to J. M. Huang, filed on Jun. 8, 1995, teaches the use of a low dielectric constant spacer to provide better immunity of the buried contact trench. Co-pending U.S. patent application Ser. No. 08/503,173, now U.S. Pat. No. 5,607,881 also to J. M. Huang, filed on Jul. 17, 1995, teaches linking the buried contact junction and the source junction by an extra high dosage N+ implant to overcome the disadvantages of a buried contact trench. Allowed U.S. patent application Ser. No. 08/405,719, now U.S. Pat. No. 5,494,848 to H. W. Chin, filed on Mar. 17, 1995, teaches the use of a reverse tone oversized buried contact mask to prevent formation of a buried contact trench. Co-pending U.S. patent application Ser. No. 08/668,801 to C. Y. Shi et al teaches the use of TEOS sidewall spacers to prevent the formation of a buried contact trench in DRAM technology.

SUMMARY OF THE INVENTION

A principal object of the present invention is to provide an effective and very manufacturable method of forming buried contact junctions.

Another object of the present invention is to provide a method of forming buried contact junctions which avoid the formation of a trench caused by mask misalignment.

In accordance with the objects of this invention a new method of forming an improved buried contact junction is achieved. A gate silicon oxide layer is provided over the surface of a semiconductor substrate. A first polysilicon layer is deposited overlying the gate oxide layer. The first polysilicon and gate oxide layers are etched away where they are not covered by a buried contact mask to provide an opening to the semiconductor substrate. Ions are implanted through the opening into the semiconductor substrate to form a buried contact junction. A layer of dielectric material is deposited over the first polysilicon layer and over the semiconductor substrate within the opening. The layer is anisotropically etched to leave spacers on the sidewalls of the first polysilicon layer and adjacent the opening. A second layer of polysilicon is deposited overlying the first polysilicon layer and over the substrate within the opening. The second polysilicon layer is patterned to form gate electrodes and a polysilicon contact overlying the buried contact junction wherein the mask used for the patterning is misaligned and a portion of a spacer overlying the buried contact junction is exposed and wherein a portion of the second polysilicon layer other than that of the contact remains as residue. The second polysilicon layer residue is etched away wherein the exposed spacer protects the buried contact junction within the semiconductor substrate from the etching to complete the formation of a buried contact in the fabrication of an integrated circuit.

Also in accordance with the objects of the invention, an integrated circuit device having a buried contact junction with local interconnect is achieved. A buried contact junction lies within a semiconductor substrate. A dielectric material spacer overlies an edge of the Buried contact junction. A polysilicon contact layer overlies the buried contact junction. A gate electrode lies on the surface of the semiconductor substrate. Source and drain regions lie within the semiconductor substrate surrounding the gate electrode. An insulating layer overlies the gate electrode, polysilicon contact layer, and source and drain regions. A patterned conducting layer overlies the insulating layer and extends through an opening in the insulating layer to one of the underlying source and drain regions.

BRIEF DESCRIPTION OF THE DRAWINGS

In the accompanying drawings forming a material part of this description, there is shown.

DESCRIPTION OF THE PREFERRED EMBODIMENTS

Figure 1:
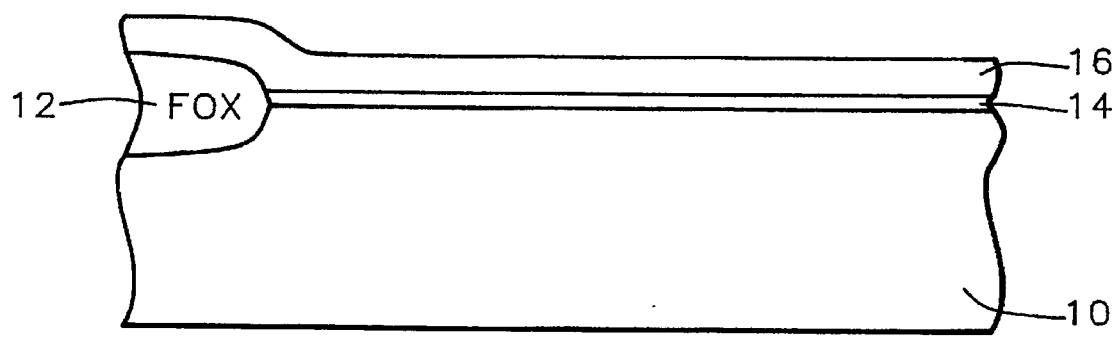
FIGS. 1 through 8 schematically illustrate in cross-sectional representation a preferred embodiment of the present invention.

Referring now more particularly to FIG. 1, there is shown a portion of a partially completed integrated circuit. There is shown a monocrystalline semiconductor substrate 10 in which there are formed field oxide regions 12. A layer of gate oxide 14 is grown over the surface of the substrate, typically to a thickness of between about 40 to 250 Angstroms.

Next, polysilicon layer 16 is deposited over the gate oxide layer 14. This layer may be a single polysilicon layer, but generally, it is a split polysilicon layer. Typically, the split polysilicon layer is a thin layer having a thickness of between about 300 to 600 Angstroms. However, in the process of the present invention, a thick split polysilicon layer is deposited. This layer 16 has a thickness of between about 1000 to 4000 Angstroms. This thick polysilicon layer is important to the formation of the protective TEOS spacers of the invention.

Figure 2:
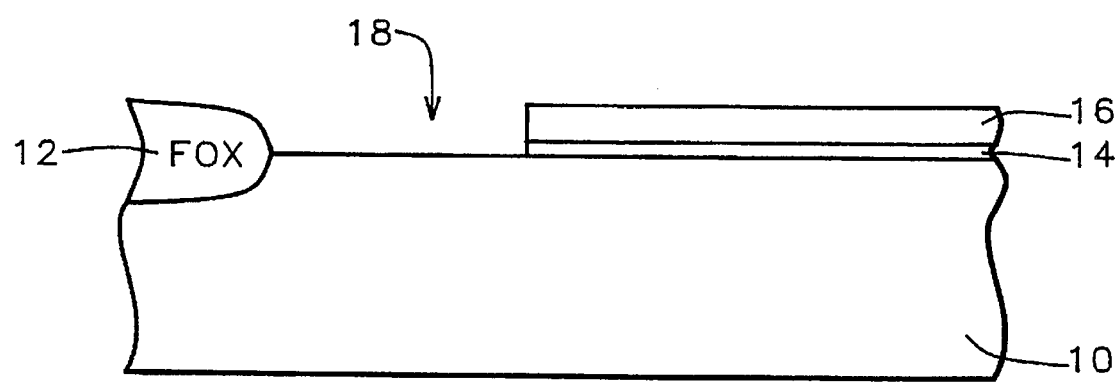

Referring now to FIG. 2, the polysilicon and gate oxide layers 16 and 14 are etched away where they are not covered by a mask to form the buried contact opening 18.

Figure 3:
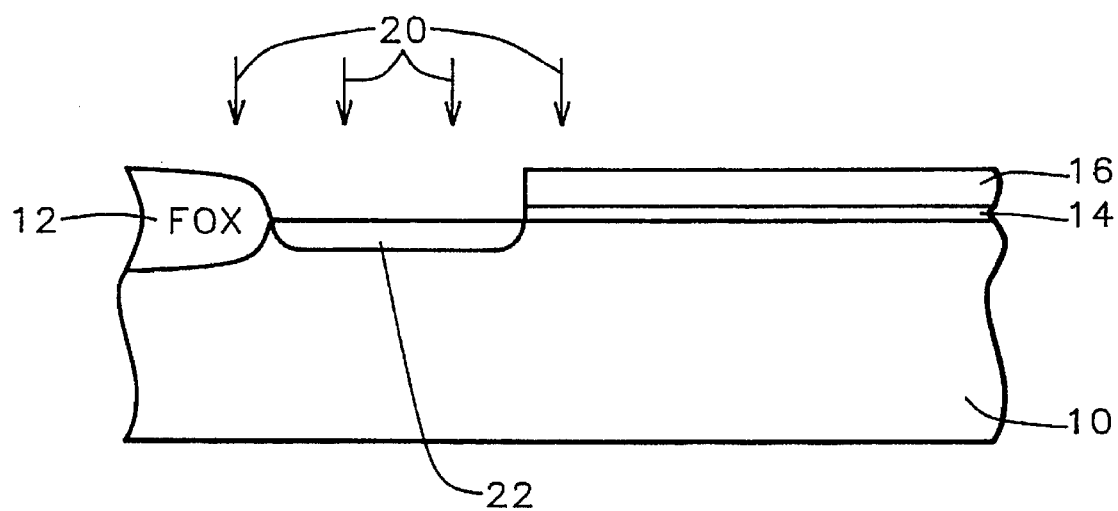

Phosphorus or Arsenic ions 20 are implanted into the substrate within the opening to form implanted region 22 which will form the buried contact junction, shown in FIG. 3. Phosphorus ions are implanted with a dosage of between about 1 E 14 to 5 E 15 atoms/cm$^2$ at an energy of between about 10 to 80 KeV. Alternately, arsenic ions are implanted at the same dosage at an energy of between about 10 to 100 KeV.

Figure 4:
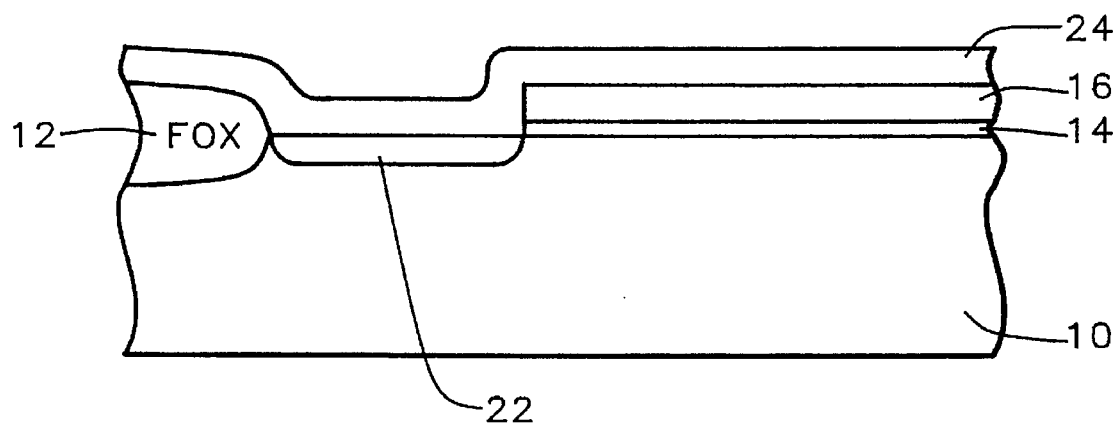
Figure 5:
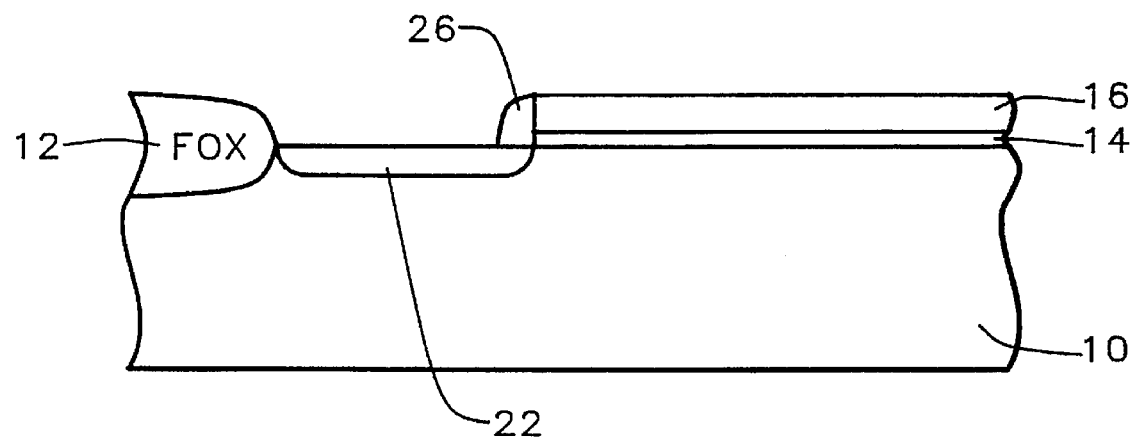

Now, the key protective spacers of the present invention will be formed by the following steps. A layer of TEOS 24 is deposited over the surface of the semiconductor substrate and within the buried contact opening, as illustrated in FIG. 4, to a thickness of between about 1000 to 3000 Angstroms. The TEOS layer 24 is anisotropically etched to leave spacers 26 on the sidewalls of the split polysilicon layer 16 adjacent the buried contact opening, as shown in FIG. 5. Alternately, another dielectric material such as silicon nitride could be used instead of TEOS for the spacers 26. The spacers 26 adjacent the buried contact opening may reduce the effective size of the opening.

Figure 6:
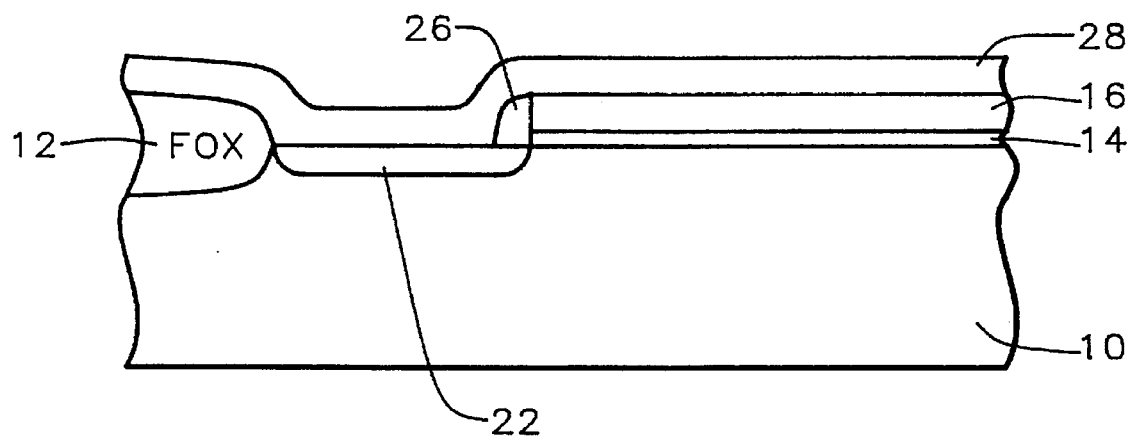

As shown in FIG. 6, a second layer of polysilicon 28 is deposited by low pressure chemical vapor deposition (LPCVD). This is typically a thick layer, having a thickness of between about 1000 to 4000 Angstroms. However, because the first split polysilicon layer of the present invention was thick, this layer can be thin, from between about 300 to 1000 Angstroms.

Figure 7:
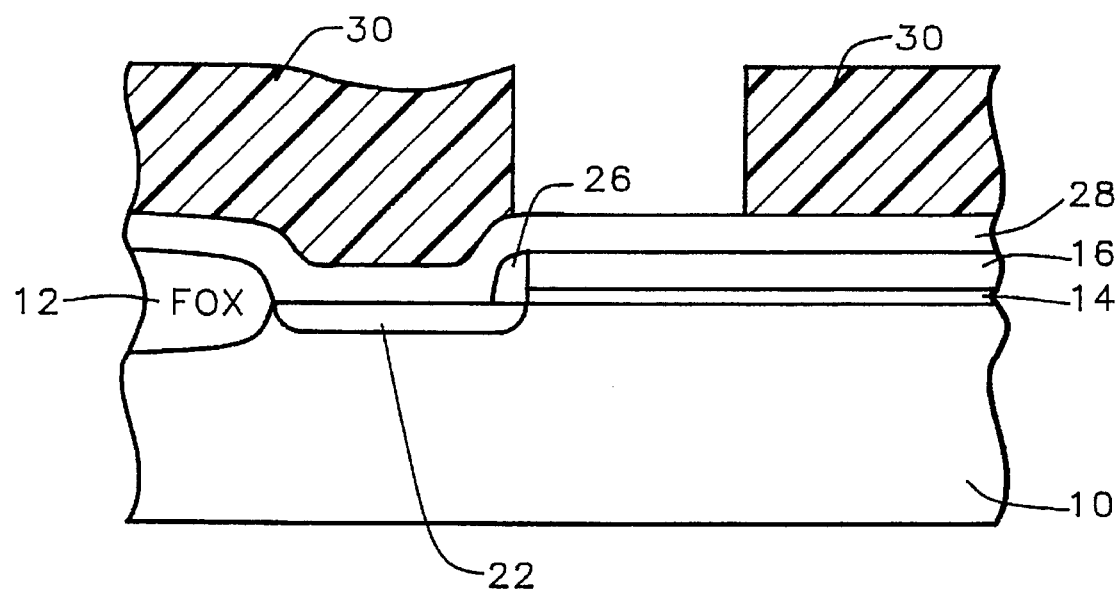

The gate electrode is now to be formed. A photoresist mask 30 is formed over the polysilicon layer 28, as shown in FIG. 7. If misalignment has occurred, the photoresist mask 30 would be shifted slightly to the left, as shown, wherein a portion of the buried contact junction 22 underlies the opening in the mask. The presence of the spacers 26 prevents the etching of a trench into the buried contact junction.

Figure 8:
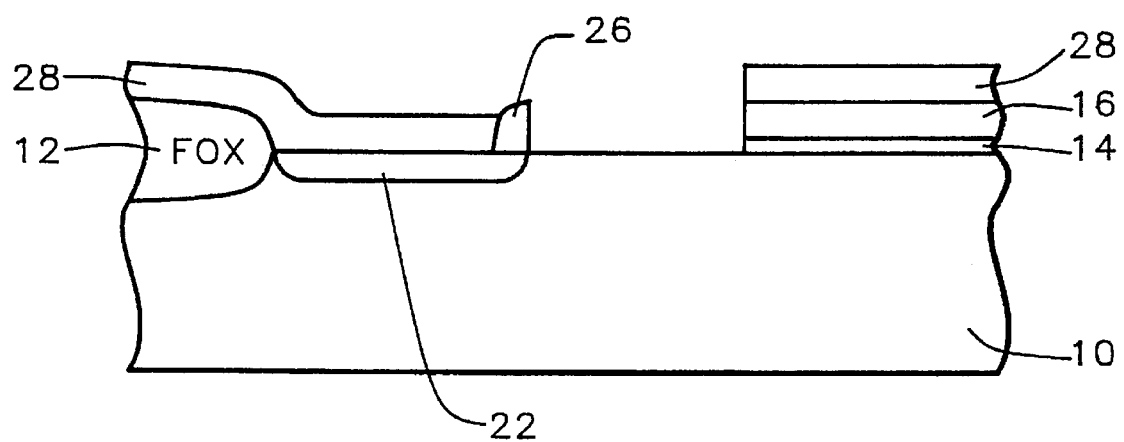
Figure 8A:
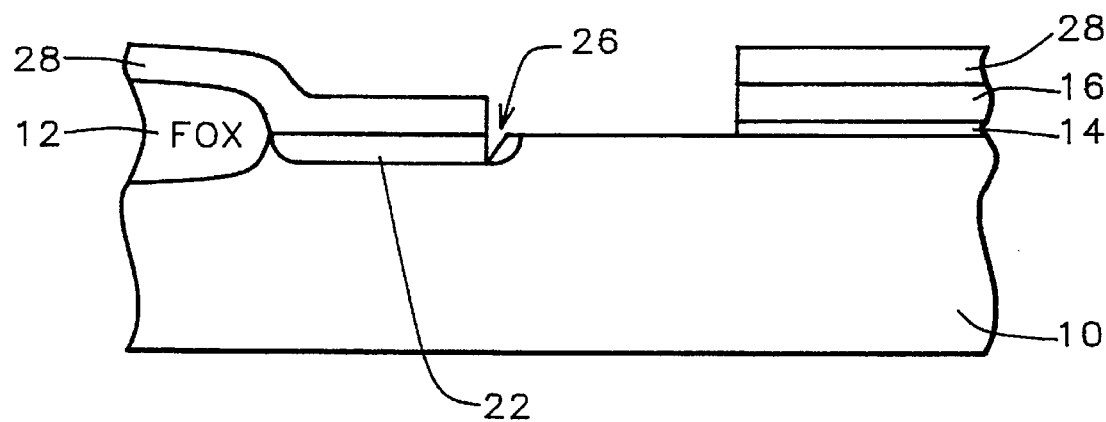
FIG. 8A schematically illustrates in cross-sectional representation a buried contact trench of the prior art.

FIG. 8A shows an integrated circuit device formed by a process of the prior art without the spacers 26. During polysilicon overetching, a trench 32 is etched into the substrate where the buried contact region 22 is exposed by the misaligned mask.

Returning to the process of the present invention, the polysilicon layer 28 is etched away where it is not covered by the mask to form the gate electrode and interconnecting lines, as illustrated in FIG. 8. The spacer 26 protects the underlying buried contact region 22 from being etched into.

Figure 9:
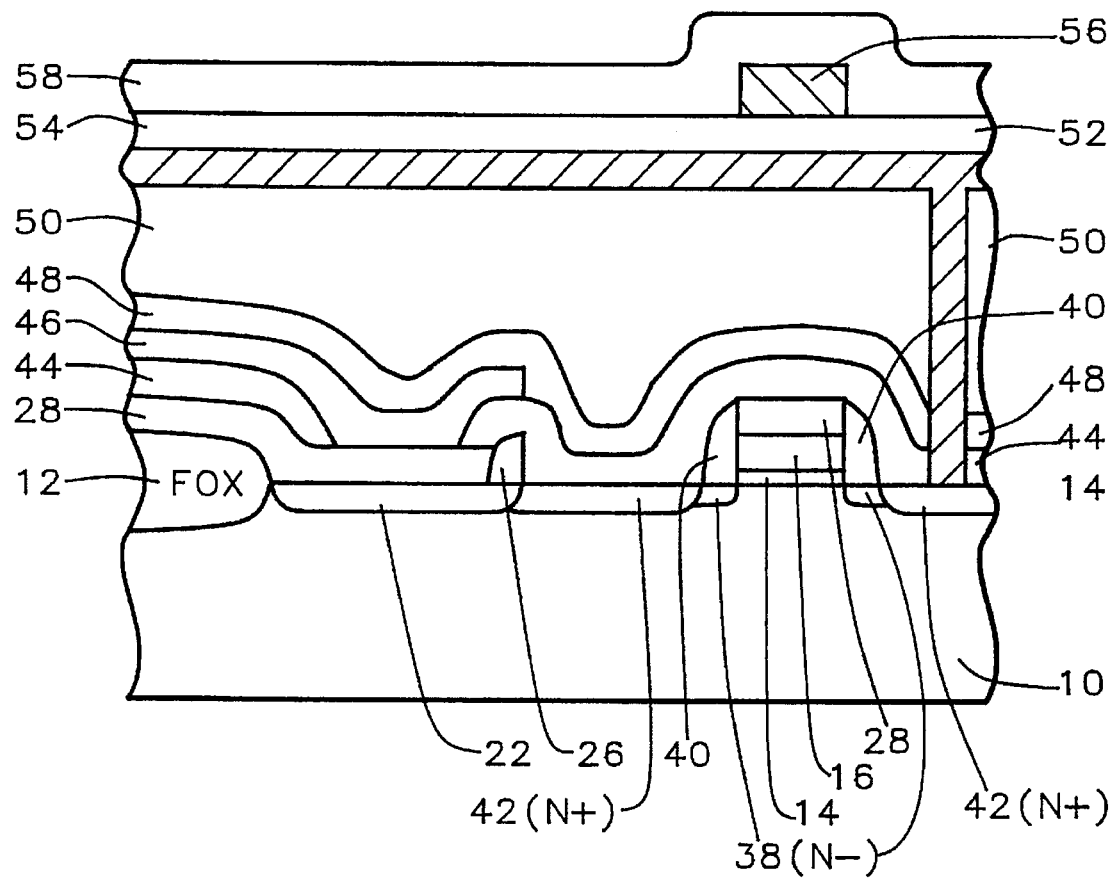
FIG. 9 schematically illustrates in cross-sectional representation a completed static random access memory (SRAM) fabricated by the process of the present invention.

Processing continues as is conventional in the art to complete the integrated circuit device. FIG. 9 illustrates a cross-sectional view of a completed SRAM integrated circuit device with electrical connections. Lightly doped source/drain (LDD) regions 38 are implanted. LDD spacers 40 are formed on the sidewalls of the gate electrode and heavily doped source and drain regions 42 are implanted into the semiconductor substrate using the gate electrode as a mask. An interpoly dielectric layer 44 is deposited over the surface of the substrate. An opening is etched to the polysilicon layer 28 and a third polysilicon layer 46 is deposited and patterned. An insulating layer overlies the double polysilicon layer. The insulating layer may be composed of a thin layer of undoped oxide 48 and a thick layer borophospho-TEOS (BP-TEOS) or borophosphosilicate (BPSG) 50. An opening is etched through the insulating layer to one of the underlying source/drain regions 42. A metal layer 52 is deposited over the surface of the substrate and within the opening and patterned. An intermetal dielectric 54 is deposited, followed by the deposition and patterning of a second metal layer 56. A passivation layer 58 completes the SRAM integrated circuit device.

The process of the invention avoids the etching of a trench into the buried contact junction because of the protective TEOS sidewall spacers. The process of the invention can be used in the fabrication of any integrated circuit device having double polysilicon and double metal layers, such as a static random access memory (SRAM) device.

Referring to FIG. 9, the integrated circuit device of the present invention having a buried contact junction with local interconnect will be described. A buried contact junction 22 lies within a semiconductor substrate 10. A dielectric material spacer 26 overlies an edge of the buried contact junction. A polysilicon contact layer 28 overlies the buried contact junction. A gate electrode 16 lies on the surface of the semiconductor substrate. Source and drain regions 42 lie within the semiconductor substrate surrounding the gate electrode. An insulating layer 44, 48, 50 overlies the gate electrode, polysilicon contact layer, and source and drain regions. A patterned conducting layer 52 overlies the insulating layer and extends through an opening in the insulating layer to one of the underlying source and drain regions 42.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact junction in a semiconductor substrate in the fabrication of an integrated circuit with local interconnect comprising:

providing a gate silicon oxide layer over the surface of said semiconductor substrate;

depositing a first polysilicon layer overlying said gate oxide layer;

etching away said first polysilicon and said gate oxide layers where they are not covered by a buried contact mask to provide an opening to said semiconductor substrate;

implanting ions through said opening into said semiconductor substrate to form said buried contact junction;

depositing a layer of dielectric material over said first polysilicon layer and over said semiconductor substrate within said opening;

anisotropically etching said dielectric material layer to leave spacers on the sidewalls of said first polysilicon layer and adjacent said opening;

depositing a second layer of polysilicon overlying said first polysilicon layer and over said substrate within said opening;

patterning said second polysilicon layer to form gate electrodes and a polysilicon contact overlying said buried contact junction; and overetching said second polysilicon layer to complete the formation of said buried contact junction in the fabrication of said integrated circuit with local interconnect.

2. The method according to claim 1 wherein said first polysilicon layer has a thickness of between about 1000 and 4000 Angstroms.

3. The method according to claim 1 wherein said gate electrode comprises two polysilicon layers having a total thickness of between about 1500 and 4500 Angstroms.

4. The method according to claim 1 wherein said dielectric material layer comprises tetraethoxysilane (TEOS) and has a thickness of between about 1000 and 3000 Angstroms.

5. The method according to claim 1 wherein said dielectric material layer comprises silicon nitride and has a thickness of between about 1000 and 3000 Angstroms.

6. The method according to claim 1 wherein said spacers have a width of between about 500 and 3000 Angstroms.

7. The method according to claim 1 wherein said second polysilicon layer has a thickness of between about 300 and 1000 Angstroms.

8. The method according to claim 1 wherein the mask used for said patterning is misaligned and wherein a portion of a spacer overlying said buried contact junction is exposed wherein said exposed spacer protects said buried contact junction within said semiconductor substrate from said etching away.

9. A method of forming a buried contact junction in a semiconductor substrate in the fabrication of an integrated circuit with local interconnect comprising:

provinding a gate silicon oxide layer over the surface of said semiconductor substrate;

depositing a first polysilicon layer overlying said gate oxide layer;

etching away said first polysilicon and said gate oxide layers where they are not covered by a buried contact mask to provide an opening to said semiconductor substrate;

implanting ions through said opening into said semiconductor substrate to form said buried contact junction;

depositing a layer of dielectric material over said first polysilicon layer and over said semiconductor substrate within said opening;

anisotropically etching said dielectric material layer to leave spacers on the sidewalls of said first polysilicon layer and adjacent said opening;

depositing a second layer of polysilicon overlying said first polysilicon layer and over said substrate within said opening;

patterning said second polysilicon layer to form gate electrodes and a polysilicon contact overlying said buried contact junction wherein the mask used for said patterning is misaligned and wherein a portion of a spacer overlying said buried contact junction is exposed and overetching said second polysilicon layer wherein said exposed spacer protects said buried contact junction within said semiconductor substrate from said overetching to complete the formation of said buried contact junction in the fabrication of said integrated circuit with local interconnect.

10. The method according to claim 9 wherein said first polysilicon layer has a thickness of between about 1000 and 4000 Angstroms.

11. The method according to claim 9 wherein said gate electrode comprises two polysilicon layers having a total thickness of between about 1500 and 4500 Angstroms.

12. The method according to claim 9 wherein said dielectric material layer comprises tetraethoxysilane (TEOS) and has a thickness of between about 1000 and 3000 Angstroms.

13. The method according to claim 9 wherein said dielectric material layer comprises silicon nitride and has a thickness of between about 1000 and 3000 Angstroms.

14. The method according to claim 9 wherein said spacers have a width of between about 500 and 3000 Angstroms.

15. The method according to claim 9 wherein said second polysilicon layer has a thickness of between about 300 and 1000 Angstroms.

16. A method of forming a buried contact junction in a semiconductor substrate in the fabrication of an integrated circuit with local interconnect comprising:

providing a gate silicon oxide layer over the surface of said semiconductor substrate;

depositing a first polysilicon layer overlying said gate oxide layer wherein said first polysilicon layer has a thickness of between about 1000 and 4000 Angstroms;

etching away said first polysilicon and said gate oxide layers where they are not covered by a buried contact mask to provide an opening to said semiconductor substrate;

implanting ions through said opening into said semiconductor substrate to form said buried contact junction;

depositing a layer of dielectric material over said first polysilicon layer and over said semiconductor substrate within said opening;

anisotropically etching said dielectric material layer to leave spacers on the sidewalls of said first polysilicon layer and adjacent said opening;

depositing a second layer of polysilicon overlying said first polysilicon layer and over said substrate within said opening wherein said second polysilicon layer has a thickness of between about 300 and 1000 Angstroms;

patterning said first and second polysilicon layers to form gate electrodes and a polysilicon contact overlying said buried contact junction wherein the mask used for said patterning is misaligned and wherein a portion of a spacer overlying said buried contact junction is exposed; and overetching said second polysilicon layer wherein said exposed spacer protects said buried contact junction within said semiconductor substrate from said overetching to complete the formation of said buried contact junction in the fabrication of said integrated circuit with local interconnect.

17. The method according to claim 16 wherein said gate electrode comprises two polysilicon layers having a total thickness of between about 1500 to 4500 Angstroms.

18. The method according to claim 16 wherein said dielectric material layer comprises tetraethoxysilane (TEOS) and has a thickness of between about 1000 to 3000 Angstroms.

19. The method according to claim 16 wherein said dielectric material layer comprises silicon nitride and has a thickness of between about 1000 to 3000 Angstroms.

20. The method according to claim 16 wherein said spacers have a width of between about 500 to 3000 Angstroms.

* * * * *